United States Patent
Toriya et al.

(10) Patent No.: US 11,441,224 B2
(45) Date of Patent: Sep. 13, 2022

(54) METHOD OF CONTROLLING SUBSTRATE PROCESSING APPARATUS, AND SUBSTRATE PROCESSING APPARATUS

(71) Applicant: TOKYO ELECTRON LIMITED, Tokyo (JP)

(72) Inventors: Daisuke Toriya, Nirasaki (JP); Yuichi Furuya, Nirasaki (JP); Toshiaki Fujisato, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 100 days.

(21) Appl. No.: 16/775,520

(22) Filed: Jan. 29, 2020

(65) Prior Publication Data
US 2020/0248306 A1    Aug. 6, 2020

(30) Foreign Application Priority Data
Jan. 31, 2019 (JP) .............................. JP2019-016324

(51) Int. Cl.
*C23C 16/458* (2006.01)
*C23C 16/46* (2006.01)

(52) U.S. Cl.
CPC ...... *C23C 16/4586* (2013.01); *C23C 16/4583* (2013.01); *C23C 16/466* (2013.01)

(58) Field of Classification Search
None
See application file for complete search history.

(56) References Cited

U.S. PATENT DOCUMENTS

| | | | | |
|---|---|---|---|---|
| 6,191,035 B1* | 2/2001 | Cheng | ............... | H01L 21/28568 118/715 |
| 6,492,612 B1* | 12/2002 | Taguchi | ............... | H01L 21/6833 219/121.43 |
| 7,156,951 B1* | 1/2007 | Gao | .................... | H01L 21/3065 118/724 |
| 2008/0224364 A1* | 9/2008 | Funk | ................. | H01L 21/32137 264/571 |

FOREIGN PATENT DOCUMENTS

JP            3104887 A       5/1991

* cited by examiner

*Primary Examiner* — David P Turocy
(74) *Attorney, Agent, or Firm* — Nath, Goldberg & Meyer; Jerald L. Meyer; Tanya E. Harkins (57) ABSTRACT

A method of controlling a substrate processing apparatus that includes a stage, an annular member, a gas introduction mechanism, an exhaust part and a heat transfer gas introduction supply/exhaust part, the method including: mounting a substrate on the stage, and mounting the annular member on the substrate to press the substrate; creating a pressure of a heat transfer gas to be supplied into a space formed between a rear surface of the substrate and a front surface of the stage using the heat transfer gas supply/exhaust part; supplying the heat transfer gas into the space from the heat transfer gas supply/exhaust part; introducing the gas from the gas introduction mechanism into a container; exhausting the heat transfer gas from the space through an orifice; subsequently, exhausting the heat transfer gas from the space; and removing the annular member from the substrate.

12 Claims, 4 Drawing Sheets

METHOD OF CONTROLLING SUBSTRATE PROCESSING APPARATUS, AND SUBSTRATE PROCESSING APPARATUS

CROSS-REFERENCE TO RELATED APPLICATION

This application is based upon and claims the benefit of priority from Japanese Patent Application No. 2019-016324, filed on Jan. 31, 2019, the entire contents of which are incorporated herein by reference.

TECHNICAL FIELD

The present disclosure relates to a method of controlling a substrate processing apparatus, and a substrate processing apparatus.

BACKGROUND

For example, there is known a substrate processing apparatus that performs a predetermined process, such as a film-forming process and the like, on a substrate.

Patent Document 1 discloses a vacuum processing apparatus that controls a temperature of a sample by introducing a heat transfer gas to a rear surface of the sample.

PRIOR ART DOCUMENT

Patent Documents

Patent Document 1: Japanese Laid-Open Patent Publication No. H03-104887

SUMMARY

According to an embodiment of the present disclosure, there is provided a method of controlling a substrate processing apparatus that includes: a stage provided inside a main body container and configured to mount a substrate thereon; an annular member configured to press the substrate mounted on the stage; a gas introduction mechanism configured to introduce a gas into the main body container; an exhaust part configured to exhaust an interior of the main body container; and a heat transfer gas introduction supply/exhaust part configured to supply or exhaust a heat transfer gas to or from a rear surface-side space which is a space between a rear surface of the substrate and a front surface of the stage, the method including: mounting the substrate on the stage, and mounting the annular member on the substrate to press the substrate; preparing a pressure of the heat transfer gas to be supplied into the rear surface-side space using the heat transfer gas supply/exhaust part; supplying the heat transfer gas into the rear surface-side space from the heat transfer gas supply/exhaust part; introducing the gas from the gas introduction mechanism into the main body container so as to perform a process on the substrate; exhausting the heat transfer gas from the rear surface-side space through an orifice in a first exhaust process; exhausting the heat transfer gas from the rear surface-side space, that occurs after the first exhaust process in a second exhaust process; and removing the annular member from the substrate.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the drawings, components having substantially identical configurations will be designated by like reference numerals with the duplicate descriptions thereof omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Processing Apparatus>

Figure 1:
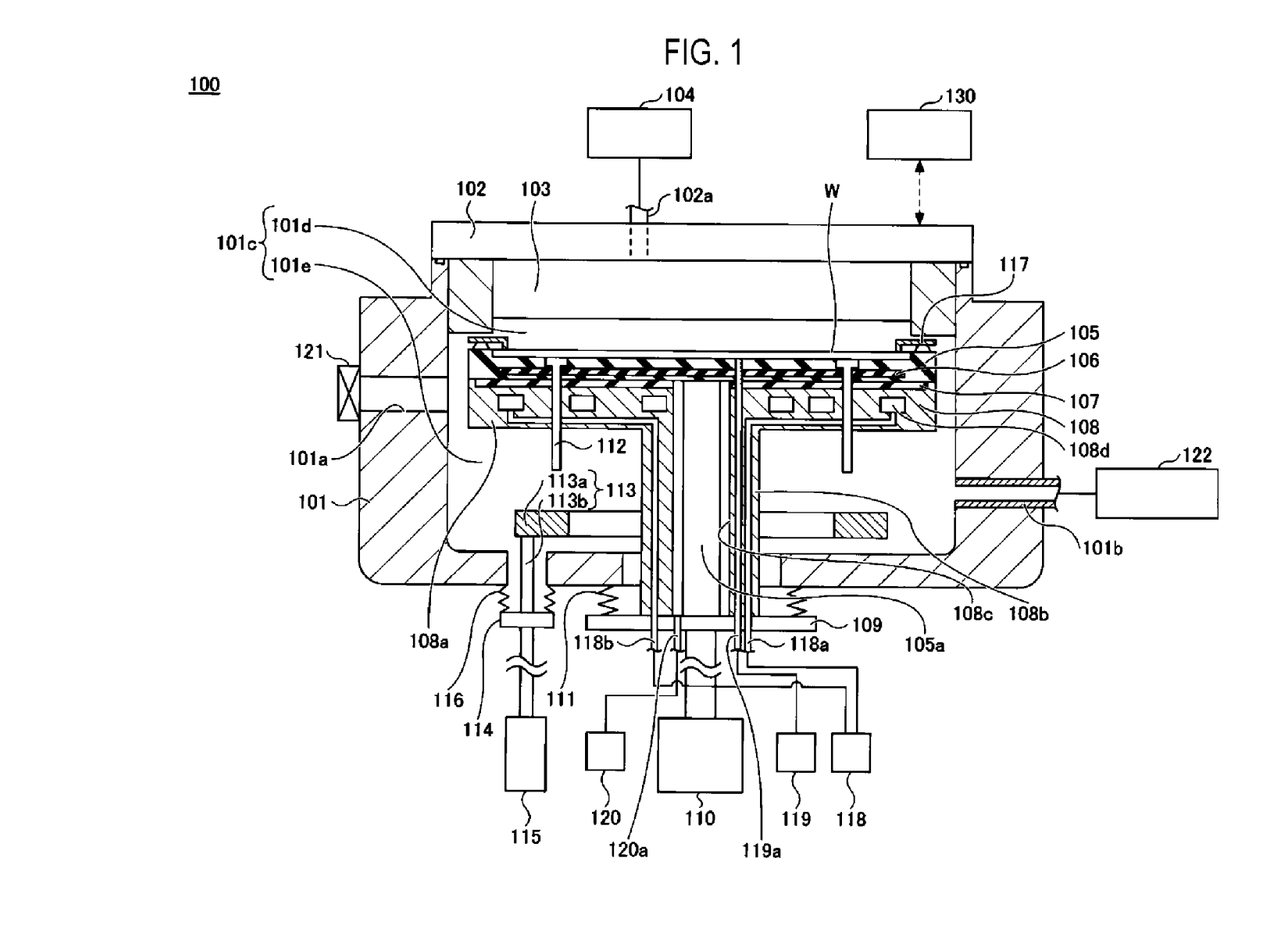
FIG. 1 is a schematic cross-sectional view showing an example of a substrate processing apparatus according to an embodiment.

An exemplary configuration of a substrate processing apparatus 100 according to an embodiment will be described with reference to FIG. 1. FIG. 1 is a schematic cross-sectional view showing an example of the substrate processing apparatus 100 according to this embodiment. The substrate processing apparatus 100 shown in FIG. 1 is a chemical vapor deposition (CVD) apparatus configured to perform a ruthenium embedding process of embedding ruthenium. For example, the substrate processing apparatus 100 performs a predetermined process of forming a ruthenium film on a wafer W by supplying a processing gas, for example, a ruthenium-containing gas such as triruthenium dodecacarbonyl $Ru_3(CO)_{12}$ to the wafer W.

A main body container 101 is a bottomed container with its upper portion opened. A support member 102 supports a gas introduction mechanism 103. Further, the support member 102 closes the upper opening of the main body container 101 so that the main body container 101 is sealed and a processing chamber 101c is formed. A gas supply part 104 supplies a processing gas such as a ruthenium-containing gas or a carrier gas to the gas introduction mechanism 103 through the support member 102 having a supply pipe 102a provided therein. The ruthenium-containing gas or the carrier gas supplied from the gas supply part 104 is supplied into the processing chamber 101c from the gas introduction mechanism 103.

A stage 105 is formed in a flat disc shape made of, for example, aluminum nitride or quartz, and mounts the wafer W thereon. A heater 106 for heating the wafer W is embedded in the stage 105. The heater 106, which includes, for example, a sheet-shaped resistance heating element, generates heat with power supplied from a power supply (not shown) to heat a mounting surface of the stage 105. Thus, the temperature of the wafer W is increased to a predetermined processing temperature suitable for film formation.

For example, the heater 106 heats the wafer W mounted on the stage 105 to 100 to 300 degrees C.

Further, the stage 105 includes a support portion 105a which extends downward from the center portion of a lower surface of the stage 105. One end of the support portion 105a penetrates the bottom of the main body container 101 and is supported by a lifting mechanism 110 through a lifting plate 109.

Further, a temperature adjustment jacket 108 used as a temperature adjustment member is disposed under the stage 105. The temperature adjustment jacket 108 has a plate portion 108a provided at an upper portion thereof and having substantially the same size as that of the stage 105, and a shaft portion 108b provided at a lower portion thereof and having a diameter larger than that of the support portion 105a. Further, the temperature adjustment jacket 108 has a hole portion 108c formed in the center portion to vertically penetrate the plate portion 108a and the shaft portion 108b.

The temperature adjustment jacket 108 accommodates the support portion 105a in the hole portion 108c. The temperature adjustment jacket 108 is disposed to cover the entire rear surface of the stage 105 while covering the support portion 105a with the hole portion 108c. Since the hole portion 108c has a diameter larger than that of the support portion 105a, a gap (not shown) is formed between the support portion 105a and the temperature adjustment jacket 108.

The temperature adjustment jacket 108 has a coolant flow path 108d formed inside the plate portion 108a. Two coolant pipes 118a and 118b are formed inside the shaft portion 108b. One end of the coolant flow path 108d is connected to the coolant pipe 118a and the other end of the coolant flow path 108d is connected to the coolant pipe 118b. The coolant pipes 118a and 118b are connected to a coolant unit 118.

The coolant unit 118 may be a chiller unit. The coolant unit 118 is configured to control the temperature of a coolant and supplies the coolant controlled to have a predetermined temperature into the coolant pipe 118a. The coolant is supplied from the coolant unit 118 into the coolant flow path 108d through the coolant pipe 118a. The coolant supplied into the coolant flow path 108d returns to the coolant unit 118 through the coolant pipe 118b. The temperature adjustment jacket 108 is configured to adjust the temperature of the coolant by circulating the coolant (for example, cooling water) through the coolant flow path 108d.

An insulating ring 107 as an insulating member is disposed between the stage 105 and the temperature adjustment jacket 108. The insulating ring 107 may be made of SUS316, A5052, Ti (titanium), or ceramic, and may be formed in a disc shape.

The insulating ring 107 has a gap formed to extend from the hole portion 108c to an edge portion of the temperature adjustment jacket 108 throughout the circumference between the insulating ring 107 and the stage 105. For example, the insulating ring 107 has a plurality of protruded portions formed in an upper surface thereof facing the stage 105.

In the insulating ring 107, the plurality of protruded portions are formed in multiple rows, for example, two rows, in a coaxial relationship with each other in a circumferential direction. In some embodiments, the protruded portions may be coaxially formed in at least one row.

The shaft portion 108b of the temperature adjustment jacket 108 penetrates through the bottom of the main body container 101. A lower end portion of the temperature adjustment jacket 108 is supported by the lifting mechanism 110 through the lifting plate 109 disposed under the main body container 101. A bellows 111 is disposed between the bottom of the main body container 101 and the lifting plate 109. The interior of the main body container 101 is hermetically sealed with the up-down movement of the lifting plate 109.

As the lifting mechanism 110 moves the lifting plate 109 upward and downward, the stage 105 is moved between a processing position (see FIG. 1) where the wafer W is processed and a transfer position (not shown) where the wafer W is transferred between an external transfer mechanism (not shown) and the main body container 101 through a loading/unloading port 101a.

Lifting pins 112 lift up the wafer W from the mounting surface of the stage 105 while supporting the lower surface of the wafer W from below when the wafer W is transferred between the external transfer mechanism (not shown) and the main body container 101. Each of the lifting pins 112 has a shaft portion and a head portion having a diameter larger than that of the shaft portion. Through-holes through which the shaft portions of the lifting pins 112 pass are formed in the stage 105 and the plate portion 108a of the temperature adjustment jacket 108. Further, grooves for accommodating the head portion of each lifting pin 112 are formed in the mounting surface of the stage 105. A contact member 113 is disposed under the lifting pins 112.

In the state where the stage 105 is moved up to the processing position (see FIG. 1) of the wafer W, the head portions of the lifting pins 112 are accommodated in the respective grooves and the wafer W is mounted on the mounting surface of the stage 105. Further, the head portions of the lifting pins 112 are fitted into the respective grooves. The shaft portions of the lifting pins 112 pass through the stage 105 and the plate portion 108a of the temperature adjustment jacket 108. Lower ends of the shaft portions of the lifting pins 112 protrude from the plate portion 108a of the temperature adjustment jacket 108. Meanwhile, in a state where the stage 105 is moved to the transfer position (not shown) of the wafer W, the lower ends of the lifting pins 112 are brought into contact with the contact member 113 and the head portions of the lifting pins 112 protrude from the mounting surface of the stage 105. Accordingly, the head portions of the lifting pins 112 lift up the wafer W from the mounting surface of the stage 105 while supporting the lower surface of the wafer W from below.

The contact member 113 has a contact portion 113a that comes in contact with the lifting pins 112 and a shaft portion 113b extending downward from the contact portion 113a. The shaft portion 113b of the contact member 113 penetrates through the bottom of the main body container 101. A lower end portion of the contact member 113 is supported by a lifting mechanism 115 through a lifting plate 114 disposed under the main body container 101. A bellows 116 is disposed between the bottom of the main body container 101 and the lifting plate 114. The interior of the main body container 101 is hermetically sealed with the up-down movement of the lifting plate 114. The lifting mechanism 115 moves the contact member 113 upward and downward by moving the lifting plate 114. When the lower ends of the lifting pins 112 are brought into contact with an upper surface of the contact member 113, upper end portions of the lifting pins 112 can support the lower surface of the wafer W.

An annular member 117 is disposed above the stage 105. In the state where the stage 105 is moved to the processing position (see FIG. 1) of the wafer W, the annular member 117 is brought into contact with an outer periphery of the upper surface of the wafer W so that the wafer W is biased toward the mounting surface of the stage 105 due to the weight of the annular member 117. Meanwhile, in the state where the stage 105 is moved to the transfer position (not shown) of the wafer W, the annular member 117 is locked by a locking member (not shown) provided above the loading/unloading port 101a. This configuration does not hamper the transfer of the wafer W by the transfer mechanism (not shown).

A heat transfer gas supply/exhaust part 119 supplies a heat transfer gas such as a He gas into a rear surface-side space 105b (see FIG. 2) between the rear surface of the wafer W mounted on the stage 105 and the front surface of the stage 105 through a pipe 119a. Further, the heat transfer gas supply/exhaust part 119 exhausts the heat transfer gas from the rear surface-side space 105b.

Figure 2:
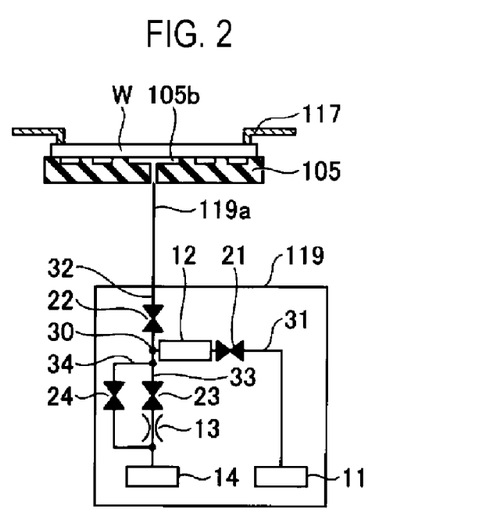
FIG. 2 is a configuration view showing an example of a heat transfer gas supply/exhaust part included in the substrate processing apparatus according to an embodiment.

A configuration of the heat transfer gas supply/exhaust part 119 will be described in detail with reference to FIG. 2. FIG. 2 is a configuration view showing an example of the heat transfer gas supply/exhaust part 119 of the substrate processing apparatus 100 according to the embodiment.

The heat transfer gas supply/exhaust part 119 includes a heat transfer gas supply part 11, a pressure regulating valve 12, an orifice 13, a heat transfer gas exhaust part 14, and a first, second, third, and fourth on-off valve 21 to 24.

A first flow path 31 is a flow path connecting the heat transfer gas supply part 11 with a junction node 30. The first on-off valve 21 and the pressing regulating valve 12 are disposed in the first flow path 31. The heat transfer gas supply part 11 supplies the heat transfer gas such as a He gas. The first on-off valve 21 opens/closes the first flow path 31. The pressure regulating valve 12 regulates a pressure of the heat transfer gas to be supplied to the junction node 30.

A second flow path 32 is a flow path connecting the junction node 30 with the pipe 119a. The pipe 119a is connected to the rear surface-side space 105b which is a space between the rear surface of the wafer W and the surface of the stage 105. The second on-off valve 22 is disposed in the second flow path 32. The second on-off valve 22 opens/closes the second flow path 32.

A third flow path 33 is a flow path connecting the junction node 30 with the heat transfer gas exhaust part 14. The third on-off valve 23 and the orifice 13 are disposed in the third flow path 33. The third on-off valve 23 opens/closes the third flow path 33. The orifice 13 creates a pressure difference. The heat transfer gas exhaust part 14 includes a vacuum pump and the line.

A fourth flow path 34 is a flow path that bypasses the third on-off valve 23 and the orifice 13 disposed in the third flow path 33 and connects the junction node 30 with the heat transfer gas exhaust part 14. The fourth on-off valve 24 is disposed in the fourth flow path 34. The fourth on-off valve 24 opens/closes the fourth flow path 34. Further, the third flow path 33 and the fourth flow path 34 may be exchanged.

Referring back to FIG. 1, a purge gas supply part 120 supplies a purge gas such as a CO gas between a lower surface of the annular member 117 and the upper surface of the stage 105 through a pipe 120a, a gap (not shown) formed between the support portion 105a of the stage 105 and the hole portion 108c of the temperature adjustment jacket 108, a flow path (not shown) formed to extend radially outward between the stage 105 and the insulating ring 107, and a flow path (not shown) formed vertically in an outer periphery of the stage 105. The purge gas suppresses the processing gas from flowing into the space between the lower surface of the annular member 117 and the upper surface of the stage 105, thereby preventing a film from being formed on the lower surface of the annular member 117 or the outer periphery of the upper surface of the stage 105.

The loading/unloading port 101a through which the wafer W is transferred, and a gate valve 121 for opening/closing the loading/unloading port 101a are provided in a sidewall of the main body container 101.

An exhaust part 122 including a vacuum pump and the like is connected to a lower portion of the sidewall of the main body container 101 through an exhaust pipe 101b. The interior of the main body container 101 is exhausted by the exhaust part 122 so that the interior of the processing chamber 101c is kept in a predetermined vacuum (of, for example, 1.33 Pa).

A controller 130 controls the operation of the substrate processing apparatus 100 by controlling the gas supply part 104, the heater 106, the lifting mechanism 110, the coolant unit 118, the heat transfer gas supply/exhaust part 119, the purge gas supply part 120, the gate valve 121, and the exhaust part 122.

<Operation of Substrate Processing Apparatus 100>

Figure 3:
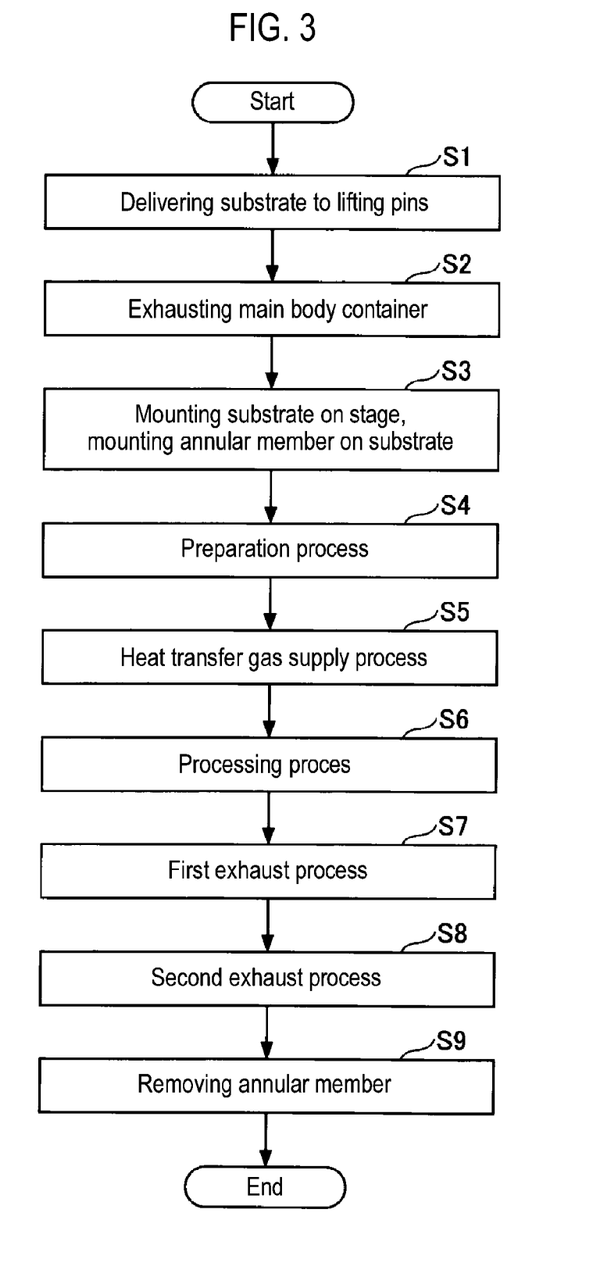
FIG. 3 is a flowchart showing exemplary operations of the substrate processing apparatus according to an embodiment.

Next, the operation of the substrate processing apparatus 100 according to the embodiment will be described with reference to FIG. 3 and FIGS. 4A to 4D. FIG. 3 is a flowchart showing an exemplary operation in the substrate processing apparatus 100 according to the embodiment. FIGS. 4A to 4D are configuration views showing the state of the heat transfer gas supply/exhaust part 119 in each process. Further, in FIGS. 4A to 4D, an opened state of each of the first, second, third, and fourth on-off valves 21 to 24 is indicated by a white empty image and a closed state thereof is indicated by a solid black image.

In step S1, the controller 130 controls the wafer W to be delivered to the lifting pins 112. Specifically, the controller 130 controls the lifting mechanism 110 to move the stage 105 to a receiving position of the wafer W. The controller 130 opens the gate valve 121. The wafer W is loaded into the processing chamber 101c of the main body container 101 by a transfer mechanism (not shown). The controller 130 controls the lifting mechanism 115 to move the lifting pins 112 upward. As a result, the wafer W is supported by the lifting pins 112. When the transfer mechanism (not shown) is withdrawn from the loading/unloading port 101a, the controller 130 closes the gate valve 121.

In step S2, the controller 130 controls the exhaust part 122 to exhaust the main body container 101. Accordingly, the rear surface-side space 105d formed when the wafer W is mounted on the stage 105 is brought to a vacuum.

In step S3, the controller 130 mounts the wafer W on the stage 105 and mounts the annular member 117 on the wafer W. Specifically, the controller 130 controls the lifting mechanism 115 to move the lifting pins 112 downward. Accordingly, the wafer W is mounted on the stage 105. In some embodiments, the wafer W may be mounted on the stage 105 by moving the stage 105 upward. Further, the controller 130 controls the lifting mechanism 110 to move the stage 105 upward. Thus, the annular member 117 is brought into contact with the outer periphery of the upper surface of the wafer W so that the wafer W is pressed onto the mounting surface of the stage 105 by the weight of the annular member 117.

In step S4, the controller 130 performs a preparation process.

Figure 4A:
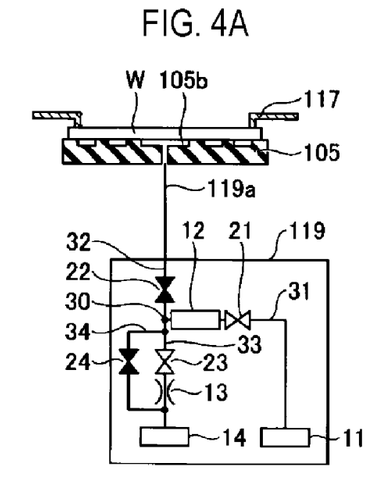
FIGS. 4A to 4D are configuration views showing the state of a heat transfer gas supply/exhaust part in each process.

In the preparation process, the pressure level of a heat transfer gas to be supplied to the rear surface-side space 105b is prepared. The state of the heat transfer gas supply/exhaust part 119 in this case is shown in FIG. 4A. The controller 130 opens the first on-off valve 21 and the third on-off valve 23, and closes the second on-off valve 22 and the fourth on-off valve 24. Further, the controller 130 controls the pressure regulation valve 12 such that the pressure at the junction node 30 becomes a predetermined pressure (e.g., 1 Torr to 10 Torr). Further, a sensor for sensing the pressure at the junction node 30 may be provided. The controller 130 may control the pressure regulation valve 12 based on the measured value obtained by the sensor. Further, the predetermined pressure may be used as the pressure in the rear surface-side space 105*b* in a processing process (to be described below).

Further, the preparation process includes a preliminary heating process of heating the wafer W in advance. Specifically, the controller 130 controls the gas supply part 104 to supply, for example, a N₂ gas, into an upper space 101*d*. Further, the controller 130 operates the heater 106. Accordingly, a pressure (e.g., 5 Torr to 20 Torr) of the upper space 101*d* formed at the side of the front surface of the wafer W becomes greater that the pressure (e.g., 1 Torr to 10 Torr) of the rear surface-side space 105*b* formed at the side of the rear surface of the wafer W, so that the wafer W is pressed into close contact with the stage 105. In this configuration, it is possible to fix the wafer W using the annular member 117 in a uniform pressure, radiate the heat of the stage 105 to the wafer W and increase the temperature of the wafer W. Further, a heat generated by a heater (not shown) provided in the sidewall or the like of the main body container 101 or a heater (not shown) of the gas introduction mechanism 103 is radiated to the wafer W through the N₂ gas in the upper space 101*d*. Accordingly, it is possible to introduce the heat transfer gas to the rear surface of the wafer W without using an electrostatic chuck that can bring the wafer W in close contact with a stage by virtue of an electrostatic attractive force.

Figure 4B:
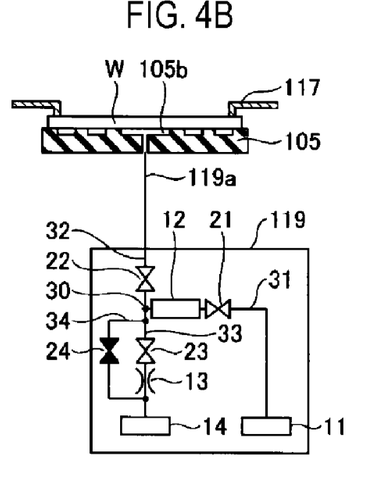

In step S5, the controller 130 performs a heat transfer gas supply process of supplying the heat transfer gas to the rear surface-side space 105*b*. The state of the heat transfer gas supply/exhaust part 119 in this case is shown in FIG. 4B. The controller 130 opens the second on-off valve 22. Further, the controller 130 controls the pressure regulation valve 12. Accordingly, the heat transfer gas is supplied to the rear surface-side space 105*b*. The pressure at the junction node 30 has been adjusted to the predetermined pressure in the preparation process of step S4. Accordingly, it is possible to prevent the wafer W from being displaced, which may be caused when the pressure of the rear surface-side space 105*b* is rapidly increased and the wafer W is lifted up during the supply of the heat transfer gas to the rear surface-side space 105*b*.

In step S6, the controller 130 performs a processing process. The controller 130 controls the exhaust part 122 to exhaust the N₂ gas in the processing chamber 101*c* so that the interior of the processing chamber 101*c* becomes a vacuum. The controller 130 operates the heater 106 and controls the gas supply part 104 to supply a processing gas such as a ruthenium gas or a carrier gas from the gas introduction mechanism 103 into the upper space 101*d* of the processing chamber 101*c*. Accordingly, a predetermined process such as film formation or the like is performed on the wafer W. After the predetermined process, the gas passes through a flow path formed at the side of an upper surface of the annular member 117 from the upper space 101*d*, flows into a lower space 101*e*, and is then exhausted from the exhaust pipe 101*b* by the exhaust part 122.

At this time, the heat transfer gas has been supplied to the rear surface-side space 105*b* by the heat transfer gas supply/exhaust part 119. Further, the controller 130 controls the purge gas supply part 120 to supply a purge gas between the lower surface of the annular member 117 and the upper surface of the stage 105. The purge gas passes through a flow path formed at the side of the lower surface of the annular member 117, flows into the lower space 101*e*, and is then exhausted from the exhaust pipe 101*b* by the exhaust part 122. After the predetermined processing process is finished, a subsequent step begins.

Figure 4C:
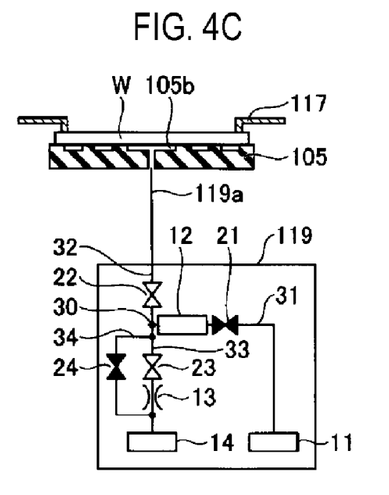

In step S7, the controller 130 performs a first exhaust process. The state of the heat transfer gas supply/exhaust part 119 in this case is shown in FIG. 4C. The controller 130 closes the first on-off valve 21. Accordingly, the supply of the heat transfer gas to the rear surface-side space 105*b* is stopped. Further, the heat transfer gas in the rear surface-side space 105*b* is exhausted to the heat transfer gas exhaust part 14 through the pipe 119*a*, the second flow path 32, the junction node 30, and the third flow path 33. In the first exhaust process, the gas is exhausted through the orifice 13. It is therefore possible to prevent a rapid drop in the pressure in the rear surface-side space 105*b*.

Figure 4D:
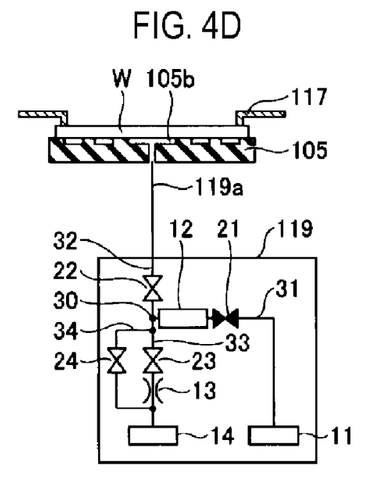

In step S8, the controller 130 performs a second exhaust process. The state of the heat transfer gas supply/exhaust part 119 in this case is shown in FIG. 4D. The controller 130 opens the fourth on-off valve 24. At this time, the fourth on-off valve 24 may remain open for a specific period of time, may be opened in an intermittent manner, or may be controlled in a combination thereof. Accordingly, the heat transfer gas in the rear surface-side space 105*b* is exhausted to the heat transfer gas exhaust part 14 through the pipe 119*a*, the junction node 30, the second flow path 32, and the fourth flow path 34 while bypassing the orifice 13. Thus, it is possible to decrease the pressure of the rear surface-side space 105*b* to a vacuum, namely to sufficiently reduce the pressure difference between the rear surface-side space 105*b* and the upper space 101*d*. Further, although the gas was described to be exhausted through both the third flow path 33 and the fourth flow path 34 in FIG. 4D, the gas may be exhausted using only the fourth flow path 34 with the third on-off valve 23 closed.

In step S9, the controller 130 removes the annular member 117 pressing the wafer W. Specifically, the controller 130 controls the lifting mechanism 110 to move the stage 105 to the receiving position. At this time, the stage 105 is moved downward and the annular member 117 is locked by a locking part (not shown). In this case, the pressure difference between the rear surface-side space 105*b* and the upper space 101*d* has been sufficiently reduced in the exhaust process of steps S7 and S8. Accordingly, even though the annular member 117 pressing the wafer W against the stage 105 by its own weight is removed, it is possible to lift the wafer W up by the pressure difference between the rear surface-side space 105*b* and the upper space 101*d* and prevent the displacement of wafer W.

Further, after the annular member 117 is removed from the wafer W, when the stage 105 is moved to the receiving position, the lower ends of the lifting pins 112 are brought into contact with the contact member 113. Accordingly, the head portions of the lifting pins 111 protrude from the mounting surface of the stage 105 and lift up the wafer W from the mounting surface of the stage 105, so that the wafer W is moved away from the mounting surface of the stage 105. In this process, the controller 130 controls the exhaust part 122 such that the difference between the pressure of the upper space 101*d* at the side of the front surface of the wafer W and the pressure of the rear surface-side space 105*b* at the side of the rear surface of the wafer W is minimal (for example, the difference is reduced to 1 Torr or less). Subsequently, the controller 130 opens the gate valve 121. In this state, the wafer W mounted on the lifting pins 112 is taken out by the external transfer mechanism (not shown). After the transfer mechanism (not shown) is withdrawn from the loading/unloading port 101*a*, the controller 130 closes the gate valve 121.

As described above, according to the substrate processing apparatus 100 of the embodiment, it is possible to perform a predetermined process such as film formation or the like on the wafer W.

Further, according to the substrate processing apparatus 100 of the embodiment, the pressure at the junction node 30 is set to the predetermined pressure in the preparation process of step S4, and subsequently, the second on-off valve 22 is opened and the heat transfer gas is supplied to the rear surface-side space 105*b* in the heat transfer gas supply process of step S5. Accordingly, it is possible to prevent the pressure in the rear surface-side space 105*b* from being rapidly increased. Further, according to the substrate processing apparatus 100 of the embodiment, it is possible to increase the temperature of the wafer W in the preparation process of step S4.

Further, according to the substrate processing apparatus 100 of the embodiment, when the heat transfer gas in the rear surface-side space 105*b* is exhausted, the first exhaust process using the orifice 13 and the second exhaust process bypassing the orifice 13 are performed. Accordingly, it is possible to prevent the pressure in the rear surface-side space 105*b* from being rapidly decreased.

Further, according to the substrate processing apparatus 100 of the embodiment, the pressure in the rear surface-side space 105*b* is decreased before the annular member 117 is removed. Accordingly, even though the annular member 117 pressing the wafer W against the stage 105 is removed, it is possible to lift up the wafer W with the pressure difference between the rear surface-side space 105*b* and the upper space 101*d*, and prevent the displacement of the wafer W.

Further, it is possible to prevent the heat transfer gas in the rear surface-side space 105*b* from diffusing into the main body container 101 by sufficiently decreasing the difference between the pressure in the upper space 101*d* and the pressure in the rear surface-side space 105*b* when the wafer W is moved away from the mounting surface of the stage 105.

According to the present disclosure in some embodiments, it is possible to provide a method of controlling a substrate processing apparatus and a substrate processing apparatus, which are capable of appropriately controlling the supply of a heat transfer gas.

Although the embodiments of the substrate processing apparatus 100 have been described above, the present disclosure is not limited thereto and may be changed and modified in various ways within the range of the spirit of the present disclosure described in claims.

The exhaust part 122 (see FIG. 1) configured to exhaust the processing chamber 101*c* and the heat transfer gas exhaust part 14 (see FIG. 2) configured to exhaust the rear surface-side space 105*b* may be provided independently from each other, and may share a vacuum pump and the like.

What is claimed is:

1. A method of controlling a substrate processing apparatus that includes: a stage provided inside a main body container and configured to mount a substrate thereon; an annular member configured to press the substrate mounted on the stage; a gas introduction mechanism configured to introduce a processing gas into the main body container; an exhaust part configured to exhaust an interior of the main body container; and a heat transfer gas supply/exhaust part configured to supply or exhaust a heat transfer gas to or from a rear surface-side space which is a space between a rear surface of the substrate and a front surface of the stage, through a pipe having one end in communication with the rear surface-side space and the other end connected to a junction node in the heat transfer gas supply/exhaust part, the method comprising:
   mounting the substrate on the stage, and mounting the annular member on the substrate to press the substrate;
   setting a pressure at the junction node in the heat transfer gas supply/exhaust part to a predetermined pressure;
   after the setting the pressure, supplying the heat transfer gas into the rear surface-side space from the heat transfer gas supply/exhaust part through the pipe and a supply path connected to the junction node;
   processing the substrate by introducing the processing gas from the gas introduction mechanism into the main body container;
   after the processing the substrate, exhausting the heat transfer gas from the rear surface-side space, including:
      a first exhaust process of exhausting the heat transfer gas from the rear surface-side space through the pipe and a first exhaust path, which is connected to the junction node and includes an orifice; and
      after the first exhaust process, a second exhaust process of exhausting the heat transfer gas from the rear surface-side space through the pipe, the first exhaust path, and a second exhaust path connected to the junction node and bypassing the orifice; and
   removing the annular member from the substrate,
   wherein the second exhaust path includes an on-off valve, and the second exhaust process includes controlling opening the on-off valve in an intermittent manner.

2. The method of claim 1, further comprising exhausting the interior of the main body container before the mounting the substrate on the stage.

3. The method of claim 2, further comprising controlling the introduction of the gas into the main body container and the supply of the heat transfer gas into the rear surface-side space before the processing the substrate, such that an internal pressure of the main body container becomes higher than a pressure of the rear surface-side space.

4. The method of claim 3, wherein the setting the pressure includes a preliminary heating process of heating the substrate before the supplying the heat transfer gas.

5. The method of claim 4, wherein at least one of the stage, the main body container, and the gas introduction mechanism includes a heating part, and
   the preliminary heating process heats the substrate using a heat provided from the heating part.

6. The method of claim 5, further comprising separating the substrate from the stage after the removing the annular member from the substrate,
   wherein the separating the substrate includes controlling the exhaust part such that a pressure difference between the internal pressure of the main body container and the pressure of the rear surface-side space is decreased.

7. The method of claim 1, further comprising controlling the introduction of the gas into the main body container and the supply of the heat transfer gas into the rear surface-side space before the processing the substrate, such that an internal pressure of the main body container becomes higher than a pressure of the rear surface-side space.

8. The method of claim 1, wherein the setting the pressure includes a preliminary heating process of heating the substrate before the supplying the heat transfer gas.

9. The method of claim 8, wherein at least one of the stage, the main body container, and the gas introduction mechanism includes a heating part, and
the preliminary heating process heats the substrate using a heat provided from the heating part.

10. The method of claim 1, further comprising separating the substrate from the stage after the removing the annular member from the substrate,
wherein the separating the substrate includes controlling the exhaust part such that a pressure difference between the internal pressure of the main body container and the pressure of the rear surface-side space is decreased.

11. The method of claim 1, wherein the setting the pressure includes setting the pressure at the junction node to be a pressure in the rear surface-side space in the processing the substrate.

12. The method of claim 1, wherein the setting the pressure includes setting the pressure at the junction node to 1 Torr to 10 Torr.

* * * * *